(12) United States Patent
Yamauchi et al.

(10) Patent No.: US 7,279,358 B2
(45) Date of Patent: Oct. 9, 2007

(54) MOUNTING METHOD AND MOUNTING DEVICE

(75) Inventors: Akira Yamauchi, Shiga (JP); Katsumi Terada, Shiga (JP); Satoru Naraba, Shiga (JP); Takashi Hare, Shiga (JP)

(73) Assignee: Toray Engineering Co., Ltd., Osaka-shi (JP)

( * ) Notice: Subject to any disclaimer, the term of this patent is extended or adjusted under 35 U.S.C. 154(b) by 429 days.

(21) Appl. No.: 10/511,986

(22) PCT Filed: Apr. 22, 2003

(86) PCT No.: PCT/JP03/05120

§ 371 (c)(1),
(2), (4) Date: Oct. 21, 2004

(87) PCT Pub. No.: WO03/092053

PCT Pub. Date: Nov. 6, 2003

(65) Prior Publication Data

US 2006/0016555 A1     Jan. 26, 2006

(30) Foreign Application Priority Data

Apr. 26, 2002   (JP)   ............................. 2002-125815

(51) Int. Cl.
*H01L 21/00*   (2006.01)
(52) U.S. Cl. .................. 438/108; 257/676; 257/785; 257/E21.499; 438/107; 438/15
(58) Field of Classification Search .................. None
See application file for complete search history.

(56) References Cited

U.S. PATENT DOCUMENTS

| 5,129,827 | A | * | 7/1992 | Hoshi et al. ................ 438/457 |
| 5,188,280 | A | | 2/1993 | Nakao et al. |
| 5,641,372 | A | * | 6/1997 | Okuno ........................ 156/230 |
| 5,916,513 | A | * | 6/1999 | Mangold et al. ........... 29/25.01 |
| 6,193,130 | B1 | * | 2/2001 | Ushiki et al. ................ 228/6.2 |
| 6,836,959 | B2 | * | 1/2005 | Watanabe et al. ............. 29/740 |
| 2002/0042161 | A1 | * | 4/2002 | Sato et al. ................... 438/109 |
| 2003/0164396 | A1 | | 9/2003 | Suga et al. |

(Continued)

FOREIGN PATENT DOCUMENTS

JP        2002-50651 A      2/2002

(Continued)

*Primary Examiner*—Sue A. Purvis
*Assistant Examiner*—Eric A Bomkamp
(74) *Attorney, Agent, or Firm*—Smith Patent Office

(57) ABSTRACT

A mounting method includes the steps of, after positioning objects being bonded relative to each other, moving a movable wall positioned there around until coming into contact with one object holding means to form a local chamber having a local enclosed space, enclosing both objects in the chamber, reducing the pressure in the chamber, moving the object holding means in a direction for reducing the volume of the chamber and moving the movable wall following the movement of the object holding means, and bonding both objects to each other by pressing. Since the bonding part and the vicinity of the bonding part can be locally and efficiently enclosed from the surroundings, and the local chamber can vary the shape of the enclosed space with the bonding operation while maintaining the enclosed state even at the time of bonding.

12 Claims, 5 Drawing Sheets

U.S. PATENT DOCUMENTS

| | | |
|---|---|---|
| 2003/0168145 A1 | 9/2003 | Suga et al. |
| 2003/0173035 A1* | 9/2003 | Yamaguchi ................ 156/580 |
| 2004/0007312 A1 | 1/2004 | Yamaguchi |

FOREIGN PATENT DOCUMENTS

| | | |
|---|---|---|
| JP | 2002-64042 A | 2/2002 |
| JP | 2002-64268 A | 2/2002 |

* cited by examiner

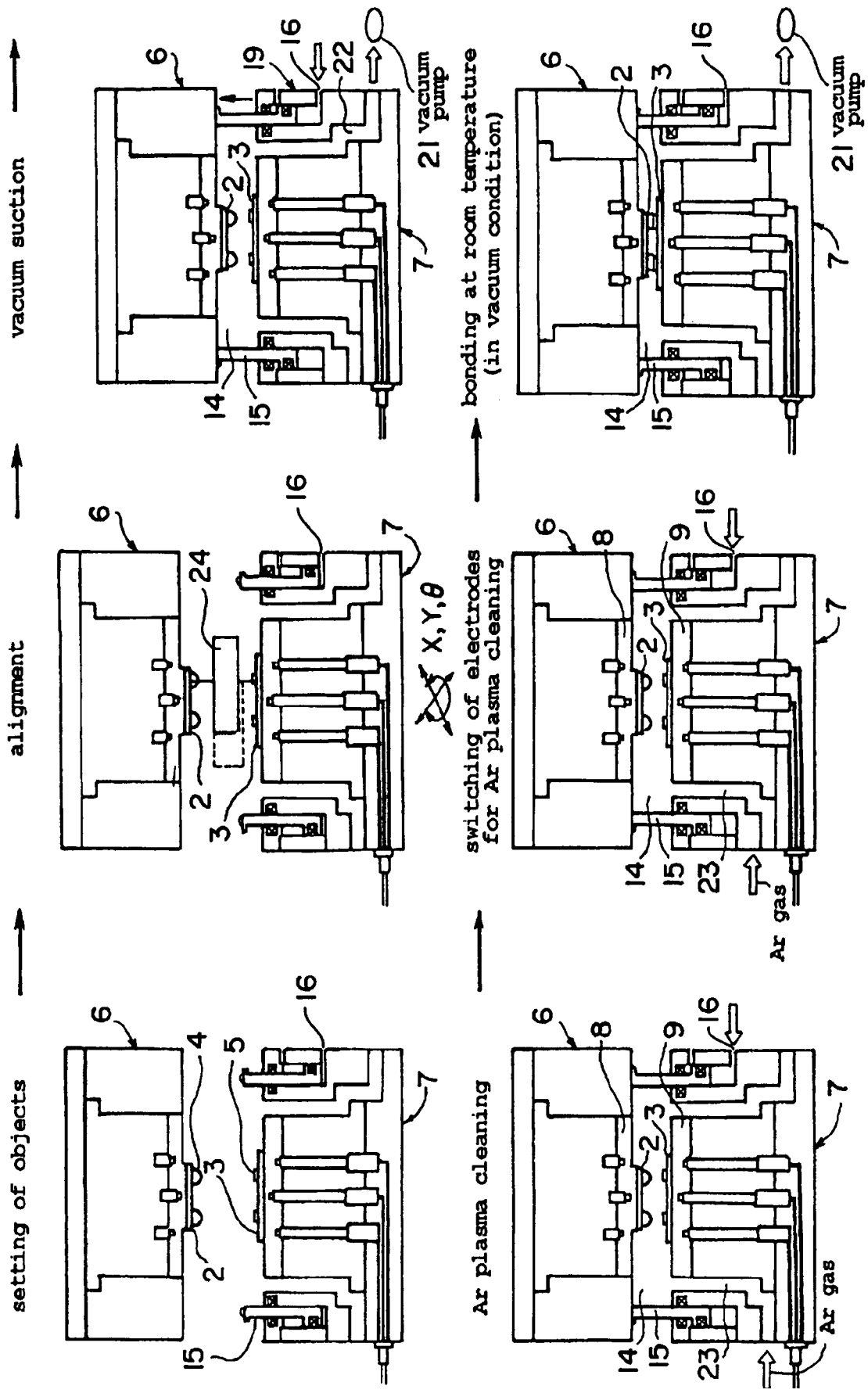

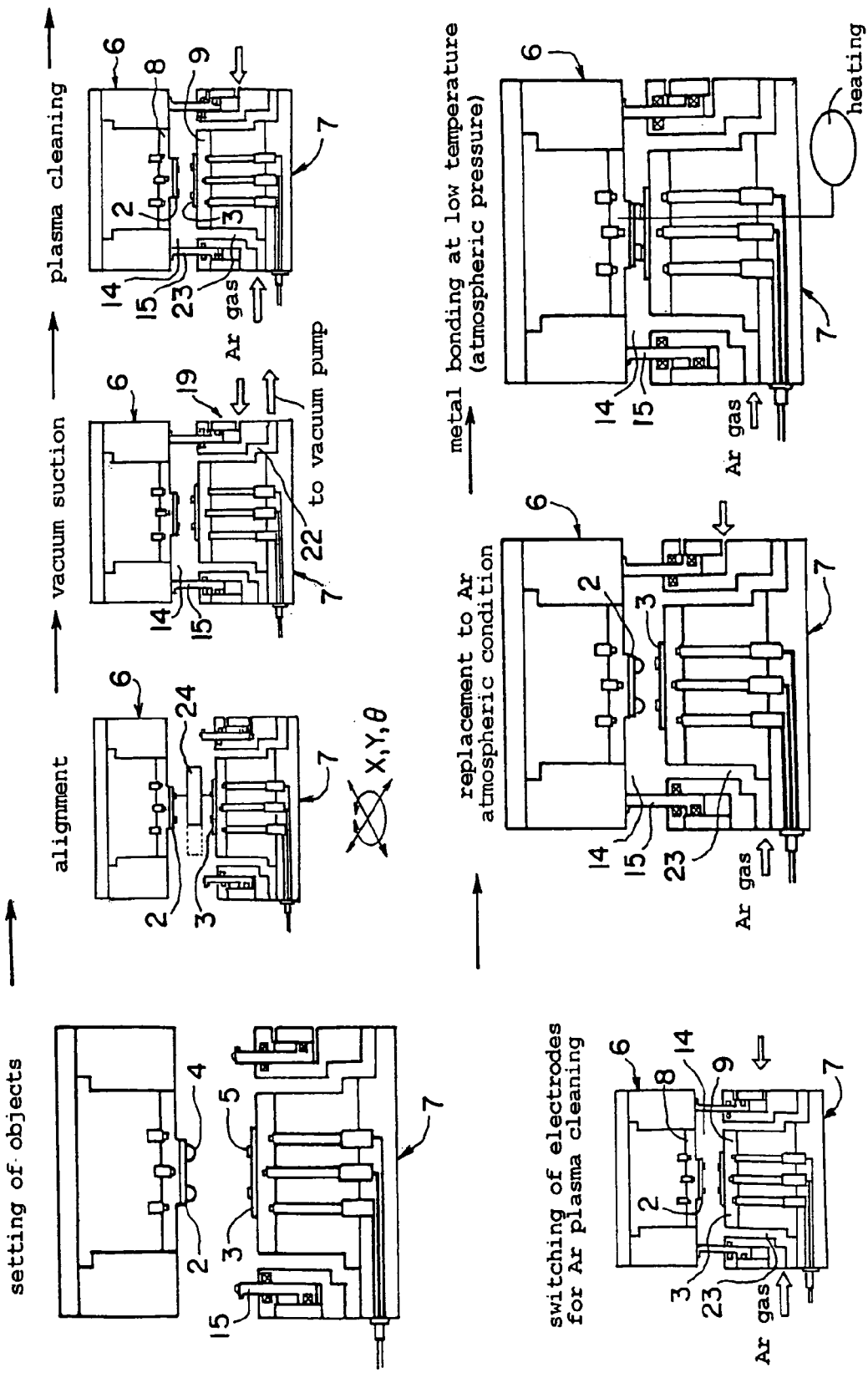

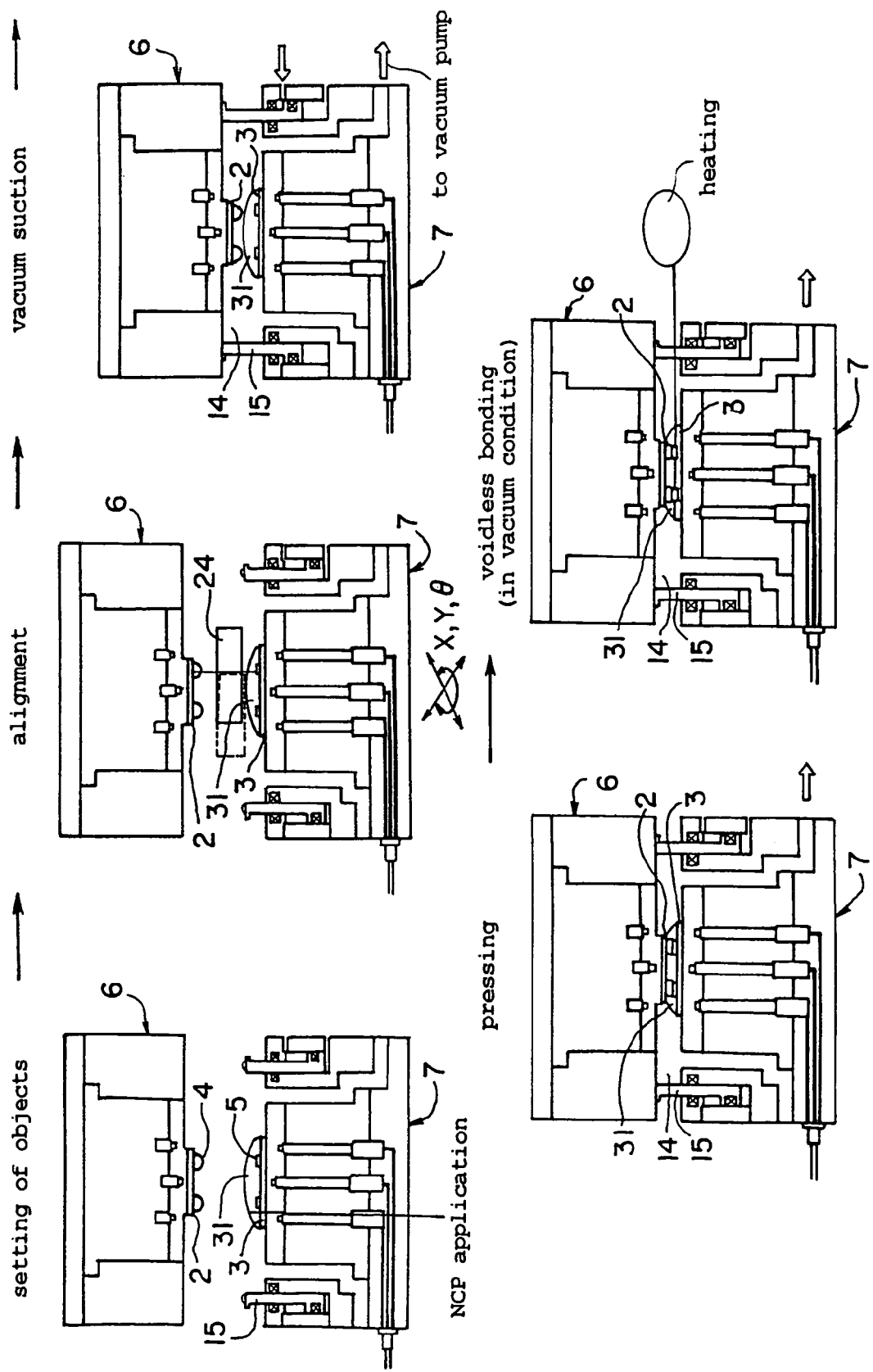

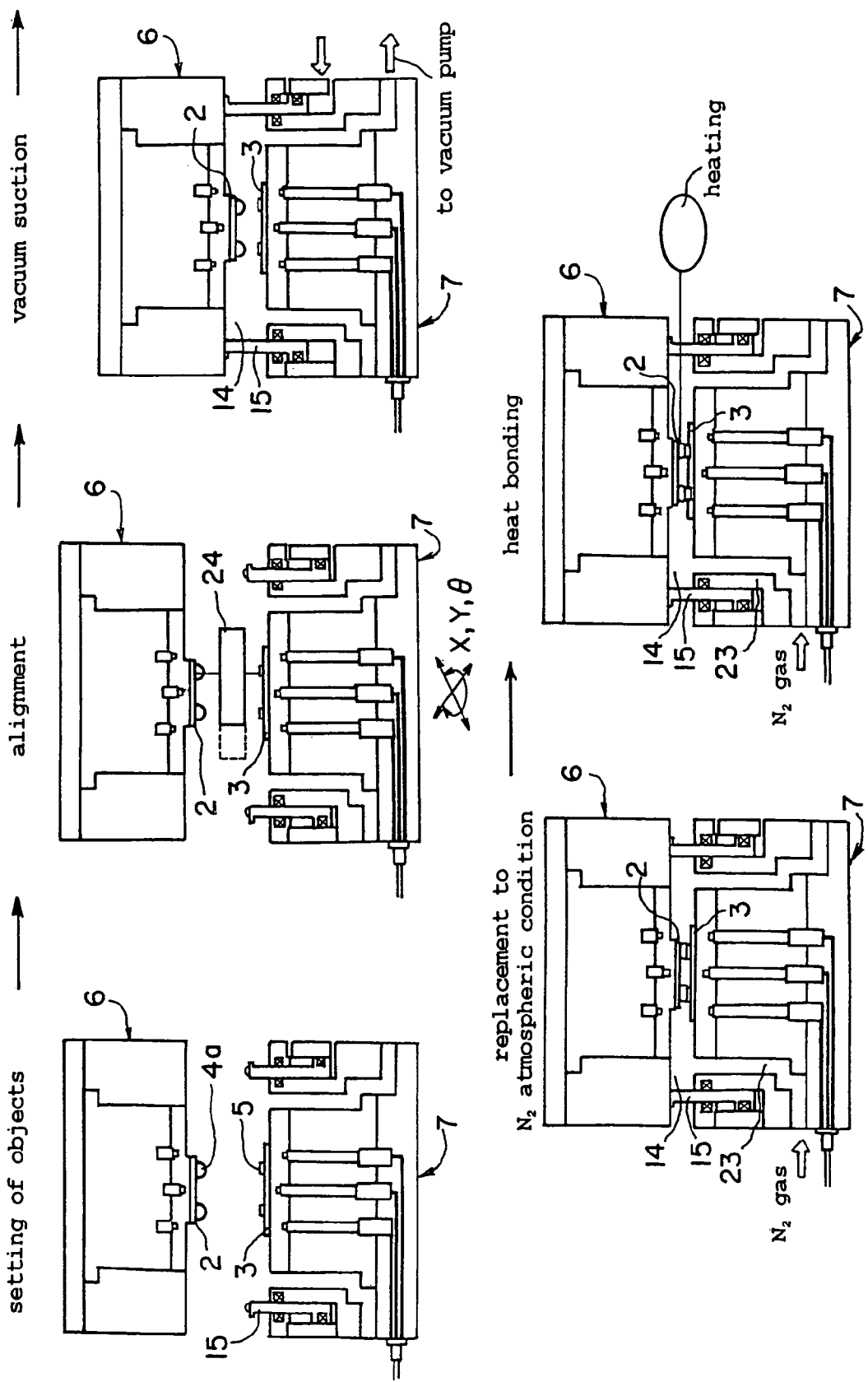

MOUNTING METHOD AND MOUNTING DEVICE

BACKGROUND OF INVENTION

1. Field of the Invention

The present invention relates to a mounting method and a mounting device for bonding objects such as chips or substrates to each other, and specifically to a method and a device for forming a local chamber structure having a movable wall for locally enclosing a bonding part from surroundings and carrying out mounting.

2. Discussion of the Related Art

Bonding objects to each other, for example, a mounting method for approaching a chip to a substrate at a condition of face down and bonding both objects to each other by pressing electrodes of the chip and the substrate to each other (as needed, accompanied with heating) is well known. Further, a method is also well known wherein, at the time of such a mounting, the mounting part is enclosed by surrounding it by a chamber, after the inside of the chamber is set at a specified atmosphere and various treatments are carried out, or after the pressure in the chamber is reduced and the inside of the chamber is set at a predetermined vacuum condition, the mounting is carried out.

However, when such a conventional chamber structure is employed, substantially the whole of the chamber, whose inner pressure is reduced, is formed as a rigid structure, the mounting is carried out in this chamber, and therefore, the structure is formed so that the whole of the mounting device or most of the mounting device is covered with the chamber. Therefore, the whole of the device including the chamber becomes a large-scale device, and there is a problem that the device becomes large and the cost thereof increases. Further, because the inside volume of the chamber also increases, it takes a long time to reduce the pressure down to a predetermined vacuum degree or to replace the atmosphere with a specified gas, and there is a case where it is difficult to achieve a high vacuum-degree condition.

SUMMARY OF THE INVENTION

Accordingly, an object of the present invention is to provide a mounting method and a mounting device which can realize a local chamber structure capable of locally and efficiently enclosing a bonding part and its vicinity from surroundings and adequately varying the shape of the enclosed space interlockingly with the bonding operation while maintaining the enclosed condition even at the time of bonding. This method and device can quickly and easily achieve a predetermined vacuum degree or specified-gas atmosphere by a small device using the local chamber structure, thereby they easily and inexpensively satisfy various required treatment conditions or mounting conditions.

To accomplish the above object, a mounting method according to the present invention comprises the steps of positioning objects being bonded to each other, which face each other with a gap, relative to each other; moving a movable wall positioned around both objects until coming into contact with one object holding means to form a local chamber having a local enclosed space and enclosing both objects in the local chamber; reducing a pressure in the local chamber to set an inside of the local chamber at a predetermined vacuum condition; and moving the object holding means in a direction for reducing a volume of the local chamber and moving the movable wall following the movement of the object holding means and bonding both objects to each other by pressing.

In this mounting method, although the mounting step accompanying the bonding operation can be started immediately after the above-described step for setting a predetermined vacuum condition, various treatment steps or a step for setting various conditions can also be interposed before starting the mounting step.

For example, in the above-described mounting method, a method can be employed wherein surfaces being bonded of the objects are cleaned in the local chamber by an energy wave or energy particle beam after the pressure in the local chamber is reduced to set the inside of the local chamber at the predetermined vacuum condition, and thereafter, the object holding means and the movable wall following the object holding means are moved and both objects are bonded to each other by pressing.

In this case, the cleaning by the energy wave or energy particle beam can be carried out under the predetermined vacuum condition. Further, a method can also be employed wherein the cleaning by the energy wave or energy particle beam is carried out after reducing the pressure in the local chamber to set the inside of the local chamber at the predetermined vacuum condition, and after the cleaning and before the bonding, the inside atmosphere of the local chamber is replaced with an atmospheric inert or oxidizing gas. Although a plasma, an ion beam, an atomic beam, a radical beam or a laser can be used as the energy wave or energy particle beam, in particular, it is preferred to use a plasma from the viewpoint of its easy handling, device cost and simple structure.

Further, in the above-described mounting method, a method can also be employed wherein a sealing material is applied onto a surface of one object before or after the pressure in the local chamber is reduced to set the inside of the local chamber at the predetermined vacuum condition, and at the sealing material applied condition and under the predetermined vacuum condition, the object holding means and the movable wall following the object holding means are moved and bonding parts of both objects are bonded to each other in the sealing material by pressing. As the sealing material, for example, a non-conductive paste (both of a paste formation and a film formation are included) or an anisotropic conductive paste (both of a paste formation and a film formation are included) can be used.

Further, in the above-described mounting method, a method can also be employed wherein the inside of the local chamber is set at an atmosphere condition of a specified gas after the pressure in the local chamber is reduced to set the inside of the local chamber at the predetermined vacuum condition, and under the specified gas atmosphere condition, the object holding means and the movable wall following the object holding means are moved and both objects are bonded to each other by pressing. In this case, the inside of the local chamber can also be set at the specified gas atmosphere condition with an atmospheric pressure. As the specified gas, an inert gas (for example, argon gas), a non-oxidizing gas (for example, nitrogen gas), a reducing gas (for example, hydrogen gas) or a substitutional gas (for example, a substitutional gas for a fluorine group) can be used. For example, in a case where heat bonding is carried out using solder bumps, a fluxless bonding under an environment replaced with a nitrogen gas becomes possible.

Further, in the above-described mounting method, it is possible to control the operational force of the movable wall at an adequate force in accordance with an operation at the present time. For example, in the step of setting the predetermined vacuum condition, by sealing the inside of the local chamber against outside by a contact force of the movable wall to the object holding means, the inside of the local chamber can be surely set at the predetermined vacuum condition.

Further, when the object holding means and the movable wall following the object holding means are moved, by substantially balancing a force acting to the object holding means by the pressure in the local chamber and a contact force of the movable wall to the object holding means, it becomes possible to suppress the force required for the movement of the object holding means and the movable wall following the object holding means to be small, thereby achieving a more smooth operation.

Furthermore, when the object holding means and the movable wall following the object holding means are moved and one object is pressed to the other object, the pressing can be performed utilizing the pressure in the local chamber by reducing a contact force of the movable wall to the object holding means. For example, in a case where an upper-side object is held by a head having a cantilever structure, it becomes possible to prevent the application of a moment due to the pressing of the head side in the above-described method, and a high-accuracy mounting becomes possible. Therefore, it becomes possible to employ such a system.

A mounting device according to the present invention for bonding both objects to each other by pressing after positioning the objects relative to each other with a gap, comprises a movable wall positioned around the objects, capable of moving until coming into contact with one object holding means to form a local chamber having a local enclosed space capable of enclosing both objects in the local chamber, and capable of moving in a direction for reducing a volume of the local chamber following the movement of the object holding means; and a vacuum suction means for reducing a pressure in the local chamber to set an inside of the local chamber at a predetermined vacuum condition.

In this mounting device, the mounting device preferably has a cylinder means as means moving the movable wall. In such a structure, by controlling the supply pressures to the respective ports of the cylinder means, the movable wall can be easily moved and the operational force of the movable wall can be controlled easily at a high accuracy. It is preferred that a seal member capable of being elastically deformed is provided at a tip of the movable wall. It becomes possible to easily bring the tip portion of the movable wall into close contact with the object holding means by the seal member, thereby surely sealing the inside of the local chamber from surroundings. Moreover, also when adjustment of parallelism between a chip and a substrate or adjustment of alignment positions thereof is carried out, an amount required for the adjustment can be absorbed by this seal member.

Further, the mounting device may have means for cleaning surfaces being bonded of the objects in the local chamber by an energy wave or energy particle beam. Further, the mounting device may have a gas supply means for replacing the inside of the local chamber with an atmosphere of an inert gas or a non-oxidizing gas at the time of and/or after cleaning by the energy wave or energy particle beam.

The energy wave or energy particle beam is preferably a plasma, and when a plasma is used, each of the object holding means preferably has an electrode for generating a plasma. In such a structure, it is possible to easily carry out a desirable plasma cleaning in the local chamber.

Further, the mounting device can be constructed as a structure having means for applying a sealing material onto a surface of one object. As the sealing material, a non-conductive paste or an anisotropic conductive paste can be used.

Further, a structure can be employed for the mounting device, wherein the mounting device has a specified gas supply means for setting the inside of the local chamber at an atmosphere condition of a specified gas after the pressure in the local chamber is reduced to set the inside of the local chamber at the predetermined vacuum condition. As the specified gas, as aforementioned, any of an inert gas, a non-oxidizing gas, a reducing gas and a substitutional gas can be used.

Further, the mounting device can be constructed as a structure wherein at least one object holding means has a heating means. In a case where mounting accompanied with heating is required, this heating means can heat the bonding part.

Furthermore, in the mounting device, it is preferred that at least one object holding means has an electrostatic chucking means for holding the object electrostatically. Because the electrostatic chucking means can exhibit an electrostatic holding force in a vacuum condition, even when the inside pressure of the local chamber is reduced, the holding state of the object can be maintained with no problem. For this holding means, as shown in FIG. 1 described later, a three layer electrode pattern for an electrostatic chuck, a plasma electrode and a heater may be provided.

In such mounting method and mounting device according to the present invention, since the local chamber structure is formed by using the movable wall, it becomes possible to locally and efficiently enclose only the portion of the objects facing each other, and to form a target vacuum condition easily and inexpensively without using a large chamber, therefore, without making the whole of the device large. Further, because this movable wall is moved following the movement of one object holding means and according to it the volume of the local chamber is properly decreased, both objects can be pressed while a target condition can be maintained, and whereby a desirable bonding is carried out. As a result, in spite of a small device, a reliable bonding state can be efficiently obtained, and a reliable mounting can be performed.

BRIEF DESCRIPTION OF THE DRAWINGS

FIG. 2 is a process flow diagram of a mounting method according to a first example of the present invention, carried out by using the mounting device shown in FIG. 1.

FIG. 3 is a process flow diagram of a mounting method according to a second example of the present invention, carried out by using the mounting device shown in FIG. 1.

FIG. 4 is a process flow diagram of a mounting method according to a third example of the present invention, carried out by using the mounting device shown in FIG. 1.

FIG. 5 is a process flow diagram of a mounting method according to a fourth example of the present invention, carried out by using the mounting device shown in FIG. 1.

DETAILED DESCRIPTION OF THE PREFERRED EMBODIMENTS

Figure 1:
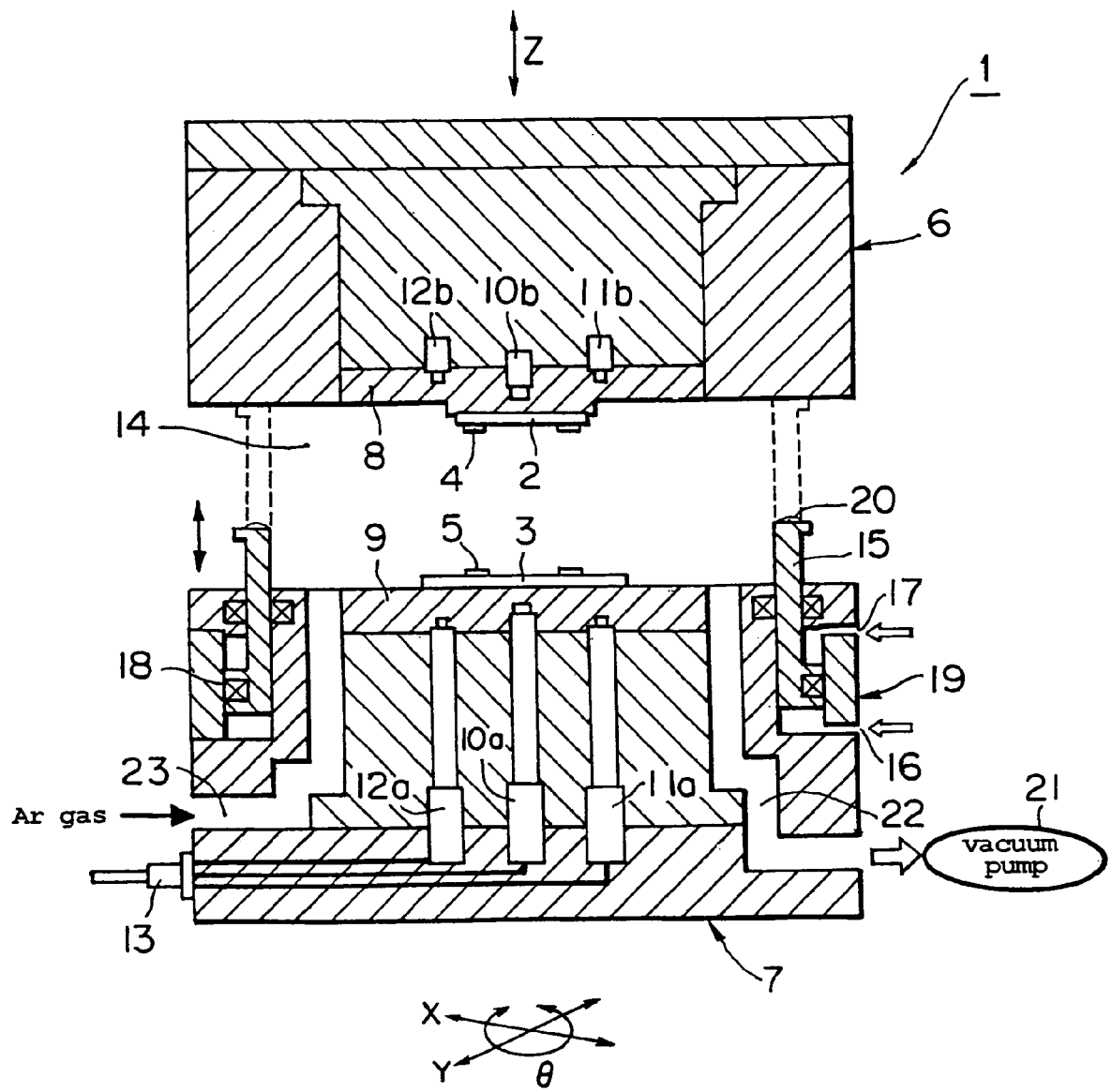
FIG. 1 is a vertical sectional view of a mounting device according to an embodiment of the present invention.

Hereinafter, desirable embodiments of the present invention will be explained referring to figures.

FIG. 1 shows a mounting device 1 according to an embodiment of the present invention. In FIG. 1, as objects facing each other with a gap, a case is exemplified where one object is a chip 2 and the other object is a substrate 3. A plurality of bumps 4 (in FIG. 1, two bumps 4 are shown) are provided on the chip 2, and corresponding pads 5 (for example, electrodes) are provided on the substrate 3. The chip 2 is held by a chip holding means 6 provided as one object holding means, and the substrate 3 is held by a substrate holding means 7 provided as the other object holding means. In this embodiment, the chip holding means 6 can be adjusted in position in Z direction (in a vertical direction), and the substrate holding means 7 can be adjusted in position in X, Y directions (a horizontal direction) and/or in a rotational direction ($\theta$ direction).

Where, the chip 2 means any object with any form being bonded to the substrate 3 regardless the kind and size, such as an IC chip, a semiconductor chip, an optoelectronic element, a surface mounting part and a wafer. The bump 4 means any kind of bump being bonded to the pad 5 provided on the substrate 3, such as a solder bump and a stud bump. Further, the substrate 3 means any object with any form being bonded to the chip 2 regardless the kind and size, such as a resin substrate, a glass substrate, a film substrate, a chip and a wafer. The pad 5 means any kind of pad being bonded to the bump 4 provided on the chip 2, such as an electrode accompanying with electric wires, a dummy electrode accompanying with no electric wire, etc.

Further, in this embodiment, the part of the chip holding means 6 directly holding the chip 2 and the part of the substrate holding means 7 directly holding the substrate 3 are constructed as electrode tools 8 and 9 capable of functioning as electrodes for generating a plasma, respectively, and a heater is incorporated thereinto, the objects can be heated via at least one electrode tool, an electrostatic chucking means is incorporated thereinto, and at least one object can be held electrostatically. Although the heater and the electrostatic chucking means are not shown in the figure, known means can be used as both of them. In FIG. 1, the label 10a shows an electrode terminal for an electrostatic chuck incorporated into the side of the substrate holding means 7, the label 11a shows a terminal for a plasma electrode, and the label 12a shows a terminal for a heater, respectively, and electricity is supplied through an electrode connector 13. As the order pattern, it is preferred that an electrostatic chuck, a plasma electrode and a heater are disposed in order from the surface layer. Similarly, the label 10b shows an electrode terminal for an electrostatic chuck incorporated into the side of chip holding means 6, the label 11b shows a terminal for a plasma electrode, and the label 12b shows a terminal for a heater, respectively.

Around both objects 2 and 3, provided is a movable wall 15 capable of moving until coming into contact with one object holding means (in this embodiment, chip holding means 6) to form a local chamber structure (a local chamber 14 is shown by the two-dot chain line in FIG. 1) having a local enclosed space for enclosing both objects in the local chamber, and capable of moving in a direction for reducing the volume of the local chamber 14 (in this embodiment, a downward moving direction) following the movement of the object holding means (in this embodiment, chip holding means 6). This movable wall 15 is formed in a cylindrical rigid structure, and it can be moved vertically in FIG. 1 by a cylinder means 19 having a movable wall lifting port 16, a movable wall lowering port 17 and an inside sealing mechanism 18. A seal member 20 capable of being elastically deformed is provided at a tip of movable wall 15, and at the above-described contact condition, the inside of the local chamber 14 can be sealed and enclosed against the outside more surely.

In the side of the substrate holding means 7, a vacuum pump 21 is connected to the local chamber 14 thus constructed, as a vacuum suction means for reducing the pressure in the local chamber 14 to set the inside of the local chamber 14 at a predetermined vacuum condition. The air or gas in the local chamber 14 is sucked by the vacuum pump 21 through a suction passage 22. Further, separately from this suction passage 22 or together with this suction passage 22, a gas supply passage 23 for supplying a specified gas such as an argon gas (Ar gas) into the local chamber 14 is provided in the side of the substrate holding means 7.

Using the mounting device 1 thus constructed, the mounting method according to the present invention can be carried out in the following various embodiments. Typical examples will be shown in FIGS. 2 to 5.

First, in the mounting method according, to a first example shown in FIG. 2, at the object setting step, the chip 2 is held on the side of the chip holding means 6 and the substrate 3 is held on the side of the substrate holding means 7. Next, at the alignment step, a recognition means 24 (for example, a recognition means having two sights of an upper sight and a lower sight) is inserted between both objects 2 and 3, the upper and lower recognition marks for positioning are read, and based on the read information, the substrate holding means 7 is adjusted in X and Y directions, and further, as needed, in $\theta$ direction, to control the relative positional relationship between both objects 2 and 3 within a predetermined accuracy range.

After the alignment, a pressure for the lifting movement of the movable wall 15 is supplied to the cylinder means 19 though the movable wall lifting port 16, and the movable wall 15 is moved until the tip of the movable wall 15 is brought into contact with the lower surface of the chip holding means 6. By this, a local chamber 14 substantially enclosed from surroundings is formed, and both objects 2 and 3 are enclosed in this local enclosed space. By sucking by the vacuum pump 21 through the suction passage 22 at the condition formed with the local chamber 14, the pressure in the local chamber 14 is reduced (vacuum sucked), and the inside of the local chamber 14 is set at a predetermined vacuum condition. As the predetermined vacuum condition, for example, a vacuum degree of $130 \times 10^{-1}$ Pa or less is employed. Because an electrostatic chuck is used for the chip 2 or the substrate 3, even if the condition is set at a high vacuum degree, the object holding state can be maintained with no problem. In a case where this vacuum degree in the local chamber 14 is maintained after this step, by keeping the contact force of the movable wall 15 to the chip holding means 6 at a proper strength, the inside of the local chamber 14 cane surely sealed from the outside and the inside can be maintained at the predetermined vacuum condition.

Next, the surfaces being bonded of the objects are cleaned by an energy wave or energy particle beam. Although this cleaning can be carried out even in the above-described high vacuum state, a plasma is used as the energy wave or energy particle beam in this example. In order to generate the plasma efficiently and easily, a required amount of Ar gas is supplied into the local chamber 14 through the gas supply passage 23 after the pressure in the local chamber 14 is reduced to set the inside of the local chamber 14 at the predetermined vacuum degree, and the inside atmosphere of the local chamber 14 is replaced with Ar gas while the inside of the local chamber 14 is maintained at the predetermined vacuum degree.

At this state, in the local chamber 14, a plasma is generated between the upper and lower electrodes (electrode tools 8 and 9), and the surfaces being bonded are cleaned by removing organic substances and foreign materials on the surfaces of the objects by the generated plasma. By this cleaning, the surfaces being bonded are activated. In this plasma cleaning under the Ar gas atmosphere, the irradiation direction of the plasma can be switched alternately by switching the polarities of the upper and lower electrodes, and it becomes possible to efficiently clean both surfaces being bonded to the chip 2 side and the substrate 3 side.

Next, the chip 2 and the substrate 3, whose bonding surfaces have been activated by the above-described plasma cleaning, are bonded to each other. In the bonding step, although the chip holding means 6 is moved down and following the movement of the movable wall 15 in contact with the chip holding means 6 is also moved down, during this movement, because the movable wall 15 is always maintained at a condition being brought into contact with the lower surface of the chip holding means 6, the good enclosed state of the inside of the local chamber 14 can be maintained as it is although the volume of the local chamber 14 is reduced. At that time, if a force acting to the chip holding means 6 by the pressure in the local chamber 14 (vacuum pressure) (a force for moving the chip holding means 6 down) and a contact force of the movable wall 15 to the chip holding means 6 are controlled at a constant relationship, the moving-down force of the chip holding means 6 can be suppressed small, and the control of a pressing force for bonding due to the chip holding means 6 after the contact of the chip 2 with the substrate 3 is facilitated.

Further, if a force acting to the chip holding means 6 by the pressure in the local chamber 14 (vacuum pressure) (a force for moving the chip holding means 6 down) and a contact force of the movable wall 15 to the chip holding means 6 are substantially balanced, in a case where the head has a cantilever structure, a moment is not generated, it is advantageous on parallelism and positional accuracy. Where, "substantially balanced" means that there is no problem even if there is a slight difference between vertical forces, because the axis of vertical movement can be maintained. Further, even at the balanced state, because the contact force does not vary, the good sealing condition can be maintained as it is.

The bumps 4 of the chip 2 and the pads 5 of the substrate 3 are brought into contact with each other and bonded to each other. Since both surfaces have been activated by the aforementioned plasma cleaning and organic substances and oxides have been removed from the bonding surfaces, a room temperature bonding in vacuum condition becomes possible.

FIG. 3 shows a mounting method according to a second example. In this example, the process from the setting of the objects to the plasma cleaning under Ar gas atmosphere condition accompanied with switching of electrodes is substantially the same as that of the first example shown in FIG. 2. In this second example, after the plasma cleaning under Ar gas atmosphere condition and under the predetermined vacuum condition accompanied with switching of electrodes is performed, Ar gas is further supplied into the local chamber 14 through the gas supply passage 23. The inside of the local chamber 14 is replaced with an atmospheric Ar gas (an atmospheric inert gas). Further, associated with that, the pressure of the movable wall lifting port is lowered down to a degree capable of maintaining the sealing.

Then, at the condition of the atmospheric Ar gas atmosphere, the chip holding means 6 is moved down, following this movement of the movable wall 15 in contact with the chip holding means 6 is also moved down, and the bumps 4 of the chip 2 and the pads 5 of the substrate 3 are bonded to each other by pressing. Under the aforementioned vacuum condition, because a pressure is applied at a sealing portion of the movable wall, in a case where a slight inclination exists on the upper and lower holding means, there is a possibility that a moment generates and a positional shift in mounting at several-micron order may occur. However, if the atmosphere is returned to an atmospheric pressure condition and thereafter the mounting is carried out, such a moment is not generated, and a higher accuracy mounting can be performed. At that time, in this embodiment, the bonding is carried out further accompanying heating. The heating can be carried out by the aforementioned incorporated heater. In this bonding step, because the bonding surfaces of the chip 2 and the substrate 3 are activated by the plasma cleaning under Ar gas atmosphere condition at the prior step, a desirable bonding can be performed by a relatively low-temperature heating. Namely, a required metal bonding between the bumps 4 of the chip 2 and the pads 5 of the substrate 3 can be achieved by a low-temperature heating.

FIG. 4 shows a mounting method according to a third example. In this example, at the step of setting the objects, or at the step of alignment, a sealing material 31 (in this example, a non-conductive paste (NCP)) is applied onto the surface being bonded of one object (in this example, substrate 3), and after the alignment, the local chamber 14 is formed by lifting the movable wall 15, and the inside thereof is vacuum sucked. At this step, first, air contained in the paste is deaerated. The inside of the local chamber 14 is set at a predetermined vacuum condition, the chip holding means 6 and the movable wall 15 are moved down, and the bumps 4 of the chip 2 are pressed onto the pads 5 of the substrate 3. At that time, although the sealing material 31 having been applied is expanded toward outside, because the sealing material 31 flows under the predetermined vacuum condition, residual air can be suppressed. Then, at the same time, or immediately after this step, the bumps 4 of the chip 2 and the pads 5 of the substrate 3 are bonded to each other accompanying heating, and at the same time, the sealing material 31 is cured. If air remains at this time of curing the sealing material 31, there is a fear that it remains at the form of voids by the increase of the volume due to the heating, but, because of a heat bonding under the predetermined vacuum condition, a voidless bonding becomes possible.

FIG. 5 shows a mounting method according to a fourth example. In this example, solder ball bumps 4a capable of being heat-melting bonded are provided as the bumps of the chip 2. In this example, the process from the step of setting the objects to the step of vacuum suction is substantially the same as that of the first example shown in FIG. 2. In this fourth example, after the inside of the local chamber 14 is set at a predetermined vacuum condition, the inside of the local chamber 14 is replaced with an atmosphere of a specified gas. In this example, a non-oxidizing gas, especially, a nitrogen gas ($N_2$ gas) with an atmospheric pressure is used as the specified gas. After the inside of the local chamber 14 is replaced with the atmospheric nitrogen gas, the chip holding means 6 and the movable wall 15 are moved down, the solder ball bumps 4a of the chip 2 are pressed onto the pads 5 of the substrate 3, and they are heat bonded. Because of heat bonding in the nitrogen gas atmosphere, a secondary oxidation ascribed to heating can be suppressed, and at a fluxless condition, the bumps 4a and the pads 5 can be bonded at a high reliability.

As shown in FIGS. 2 to 5, in the present invention, various conditions can be employed for the mounting formation. In any formation, the local chamber 14 can be efficiently formed by the vertical movement of the movable wall 15. Since the movable wall 15 is vertically moved by the cylinder means 19, it can be moved down following the movement of the chip holding means 6 and a target atmosphere in the local chamber 14 can be maintained even at the time of bonding operation, a reliable bonding state can be achieved.

Thus, in the mounting method and the mounting device according to the present invention, since a local chamber is efficiently and easily formed by a movable wall, and after the step for setting the inside of the local chamber at a predetermined vacuum condition, the object holding means and the movable wall are moved in a direction decreasing the volume of the local chamber while the inside of the local chamber is set at a target atmosphere and the state is maintained. Therefore, a desirable bonding can be performed, and a reliable bonding state can be efficiently obtained by a small device.

INDUSTRIAL APPLICATIONS OF THE INVENTION

The mounting method and the mounting device according to the present invention can be applied to any mounting performed in a predetermined atmosphere, and in particular, they are suitable for a case requiring a small device or a case requiring to form a specified atmosphere condition for mounting with a small amount of gas.

What is claimed is:

1. A mounting method comprising the steps of:
   positioning objects being bonded to each other, which face each other with a gap, relative to each other;
   moving a movable wall positioned around both objects until coming into contact with one object holding means to form a local chamber having a local enclosed space and enclosing said both objects in said local chamber;
   reducing a pressure in said local chamber to set an inside of said local chamber at a predetermined vacuum condition;
   moving said object holding means in a direction for reducing a volume of said local chamber and moving said movable wall following the movement of said object holding means and bonding said both objects to each other by pressing; and
   wherein, when said object holding means and said movable wall following said object holding means are moved, a force acting to said object holding means by the pressure in said local chamber and a contact force of said movable wall to said object holding means are substantially balanced.

2. The mounting method according to claim 1, wherein surfaces of said objects being bonded are cleaned in said local chamber by an energy wave or energy particle beam after the pressure in said local chamber is reduced to set the inside of said local chamber at said predetermined vacuum condition, and thereafter, said object holding means and said movable wall following said object holding means are moved and said both objects are bonded to each other by pressing.

3. The mounting method according to claim 2, wherein said cleaning by said energy wave or energy particle beam is carried out under said predetermined vacuum condition.

4. The mounting method according to claim 2, wherein said cleaning by said energy wave or energy particle beam is carried out after reducing the pressure in said local chamber to set the inside of said local chamber at said predetermined vacuum condition, and after the cleaning and before the bonding, the inside atmosphere of said local chamber is replaced with an atmospheric inert or oxidizing gas.

5. The mounting method according to claim 2, wherein said energy wave or energy particle beam is a plasma.

6. The mounting method according to claim 1, wherein a sealing material is applied onto a surface of one object before or after the pressure in said local chamber is reduced to set the inside of said local chamber at said predetermined vacuum condition, and at the sealing material applied condition and under said predetermined vacuum condition, said object holding means and said movable wall following said object holding means are moved and bonding parts of said both objects are bonded to each other in said sealing material by pressing.

7. The mounting method according to claim 6, wherein said sealing material is a non-conductive paste or an anisotropic conductive paste.

8. The mounting method according to claim 1, wherein the inside of said local chamber is set at an atmosphere condition of a specified gas after the pressure in said local chamber is reduced to set the inside of said local chamber at said predetermined vacuum condition, and under said specified gas atmosphere condition, said object holding means and said movable wall following said object holding means are moved and said both objects are bonded to each other by pressing.

9. The mounting method according to claim 8, wherein the inside of said local chamber is set at said specified gas atmosphere condition with an atmospheric pressure.

10. The mounting method according to claim 8, wherein an inert gas, a non-oxidizing gas, a reducing gas or a substitutional gas is used as said specified gas.

11. The mounting method according to claim 1, wherein, in said step of setting said predetermined vacuum condition, the inside of said local chamber is sealed against outside by a contact force of said movable wall to said object holding means.

12. The mounting method according to claim 1, wherein, when said object holding means and said movable wall following said object holding means are moved and a first object on said object holding means is pressed to a second object, the pressing is performed utilizing the pressure in said local chamber by reducing a contact force of said movable wall to said object holding means.

* * * * *